(12) United States Patent
Berkmann et al.

(10) Patent No.: US 9,130,728 B2
(45) Date of Patent: Sep. 8, 2015

(54) REDUCED CONTENTION STORAGE FOR CHANNEL CODING

(75) Inventors: Jens Berkmann, Munich (DE); Axel Huebner, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 1145 days.

(21) Appl. No.: 12/485,626

(22) Filed: Jun. 16, 2009

(65) Prior Publication Data

US 2010/0318755 A1  Dec. 16, 2010

(51) Int. Cl.
| | |
|---|---|
| G06F 12/00 | (2006.01) |
| G06F 13/00 | (2006.01) |
| G06F 13/28 | (2006.01) |
| H04L 1/00 | (2006.01) |
| H03M 13/29 | (2006.01) |
| H03M 13/39 | (2006.01) |
| H03M 13/00 | (2006.01) |
| G06F 12/06 | (2006.01) |

(52) U.S. Cl.
CPC ......... *H04L 1/0071* (2013.01); *H03M 13/2903* (2013.01); *H03M 13/2957* (2013.01); *H03M 13/3972* (2013.01); *H03M 13/653* (2013.01); *H03M 13/6566* (2013.01); *H04L 1/005* (2013.01); *H04L 1/0052* (2013.01); *H04L 1/0066* (2013.01); *G06F 12/0607* (2013.01)

(58) Field of Classification Search
CPC .......... G06F 12/0607; H03M 13/2903; H03M 13/2957; H03M 13/3972; H03M 13/653; H03M 13/6566; H04L 1/005; H04L 1/0052; H04L 1/0066; H04L 1/0071
USPC ........................................ 711/157
See application file for complete search history.

(56) References Cited

U.S. PATENT DOCUMENTS

| | | | |
|---|---|---|---|
| 8,135,038 B2 * | 3/2012 | Song et al. | 370/474 |
| 2003/0014700 A1 * | 1/2003 | Giulietti et al. | 714/701 |

(Continued)

FOREIGN PATENT DOCUMENTS

WO    WO 2008/067149 A2    6/2008

OTHER PUBLICATIONS

"Near Shannon Limit Error—Correcting Coding and Decoding : Turbo-Codes (1)", Claude Berrou, Alain Glavieux and Pynya Thitimajshima, Proc. of the IEEE Int. Conf. on Communication, Geneva, Switzerland, May 1993, pp. 1064-1070.

(Continued)

*Primary Examiner* — Sheng-Jen Tsai
(74) *Attorney, Agent, or Firm* — Eschweiler & Associates, LLC

(57) ABSTRACT

A decoder for decoding a concatenated code includes a storage input interleaver for storage-interleaving of received data using a storage interleaving operation. A data memory is coupled to an output of the storage input interleaver for temporary storage of storage-interleaved data. A first storage output interleaver is coupled to an output of the data memory for interleaving of data read from the data memory, and a plurality of processors are coupled to an output of the first storage output interleaver to access the data memory. Further, an encoder for generating a concatenated code sequence includes a code interleaver coupled to an input of the encoder for applying a code generation interleaving operation, a first convolutional encoder having an input coupled to an output of the code interleaver, and a storage interleaver coupled to an input of the encoder for applying a storage interleaving operation.

14 Claims, 8 Drawing Sheets

(56) References Cited

U.S. PATENT DOCUMENTS

| | | | |
|---|---|---|---|
| 2003/0028843 A1* | 2/2003 | Chang et al. | 714/786 |
| 2003/0225985 A1* | 12/2003 | Suzuki et al. | 711/157 |
| 2004/0103359 A1* | 5/2004 | Molina | 714/763 |
| 2004/0158693 A1* | 8/2004 | Dagan et al. | 712/223 |
| 2007/0195739 A1* | 8/2007 | Li | 370/535 |
| 2008/0104478 A1 | 5/2008 | Oz et al. | |
| 2008/0222372 A1* | 9/2008 | Shtalrid | 711/157 |
| 2009/0138668 A1* | 5/2009 | Blankenship | 711/157 |
| 2010/0316137 A1* | 12/2010 | Long et al. | 375/240.27 |
| 2013/0061109 A1* | 3/2013 | Eroz et al. | 714/755 |

OTHER PUBLICATIONS

"Optimal Decoding of Linear Codes for Minimizing Symbol Error Rate", L.R. Bahl, J. Cocke, P. Jelinek and J. Raviv, IEEE Transactions on Information Theory, vol. IT-20, No. 2, Mar. 1974, pp. 284-287.

"Contention-Free Interleavers", A. Nimbalker, T.E. Fuja D.J. Costello, Jr., T.K. Blankenship and B. Classon, Proc. of the IEEE Int. Symposium on Information Theory, Chicago, Illinois, Jun. 2004, p. 54.

"On Maximum Contention-Free Interleavers and Permutation Polynomials Over Integer Rings", Oscar Y. Takeshita, IEEE Transactions on Information Theory, vol. IT-52, No. 3, Mar. 2006, pp. 1249-1253.

* cited by examiner

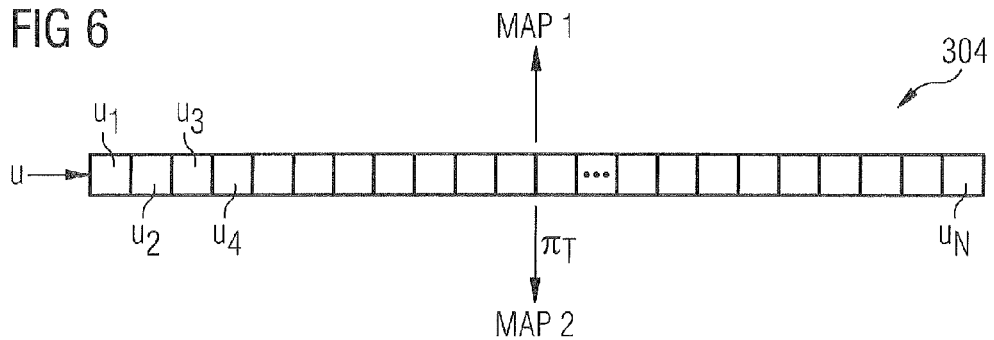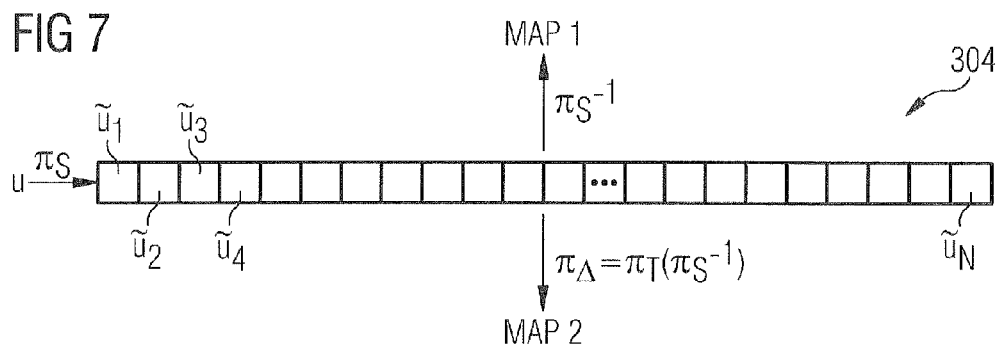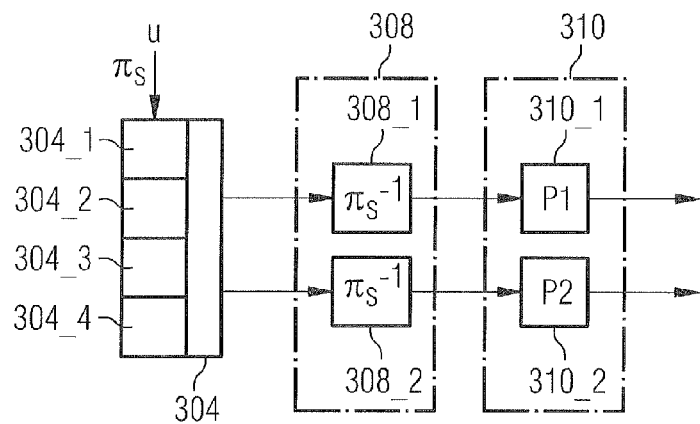

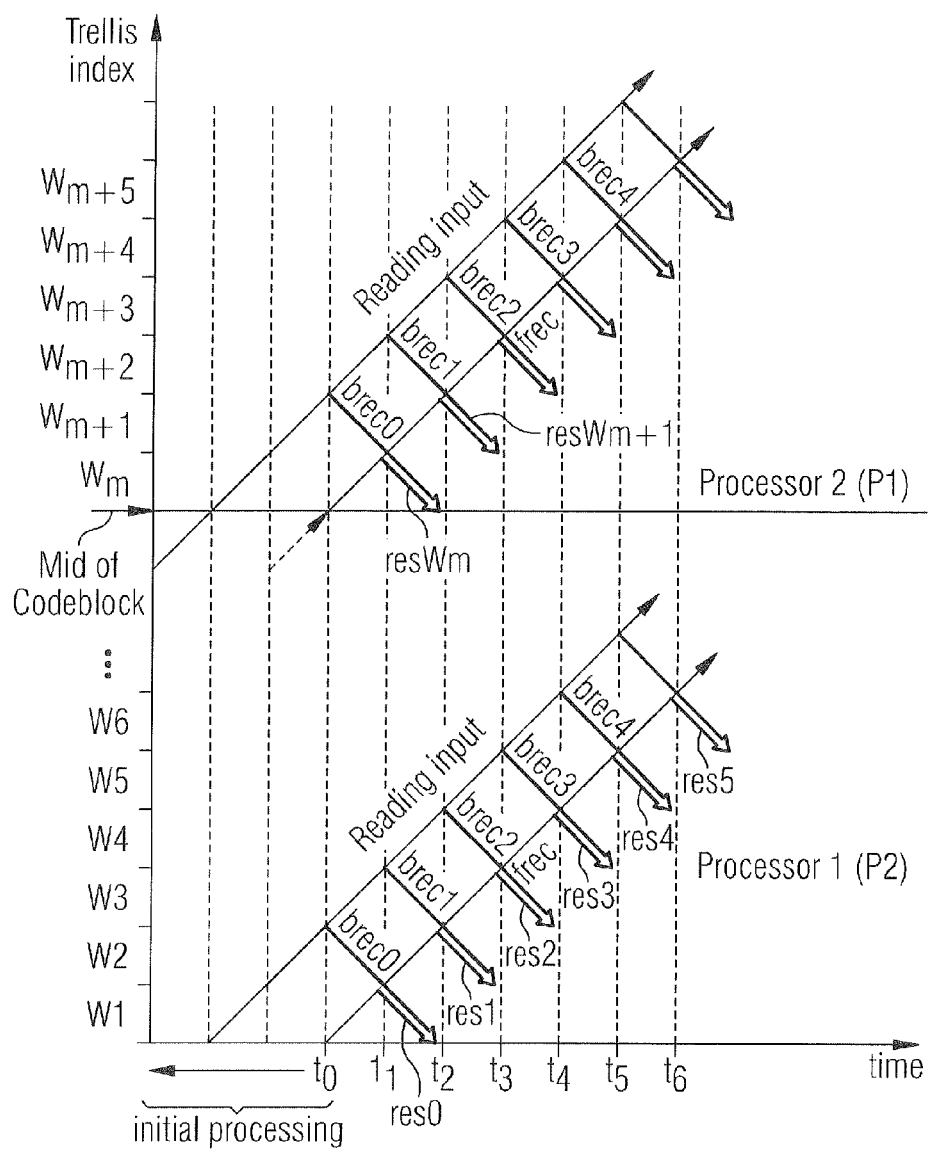

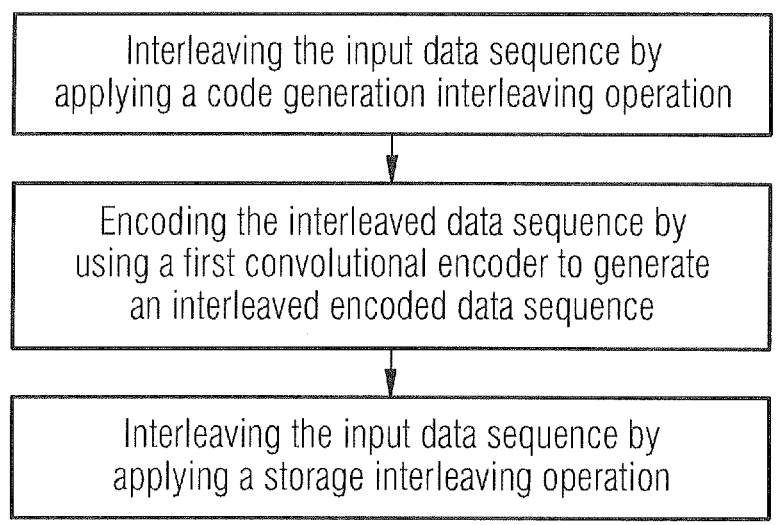

US 9,130,728 B2

REDUCED CONTENTION STORAGE FOR CHANNEL CODING

FIELD OF THE INVENTION

The invention relates to channel coding and channel decoding, and more particularly to the techniques of generating and decoding a concatenated code involving an interleaver.

BACKGROUND OF THE INVENTION

Parallel decoding algorithms are used to reach high throughput in a receiver. In parallel decoding, a plurality of processors are employed to commonly decode received coded data stored in one or more memories. In coding schemes involving an interleaver operation, two or more processors may require access to the same memory on a given clock cycle, resulting in a memory contention. Memory contention reduces the throughput of the decoder.

As a remedy, so-called contention-free interleavers may be used. However, the use of such interleavers must be part of the standard and can not be introduced belatedly. Another way to address the problem of memory contention is to enhance the number of memories, thus reducing the probability of memory access collisions. However, this increases hardware complexity.

For these and other reasons there is a need for improved receivers that reduce or eliminate memory contention.

BRIEF DESCRIPTION OF THE SEVERAL VIEWS OF THE DRAWINGS

The accompanying drawings are included to provide a further understanding of embodiments and are incorporated in and constitute part of this specification. The drawings illustrate embodiments and together with the description serve to explain principles of embodiments. Other embodiments and many of the intended advantages of embodiments will be readily appreciated as they will become better understood by reference to the following detailed description. Like reference numerals designate corresponding similar parts.

FIG. 6 is a diagram illustrating the original storage order in a memory.

FIG. 7 is a diagram illustrating an interleaved storage order in a memory.

FIG. 8 is a block diagram illustrating a section of a decoder circuitry according to one embodiment.

FIG. 9 is a diagram schematically illustrating a scheduling of two processors in a parallel decoding scheme.

FIG. 14 is a flowchart of a method of generating a concatenated code sequence according to one embodiment.

DETAILED DESCRIPTION OF THE INVENTION

Figure 1:
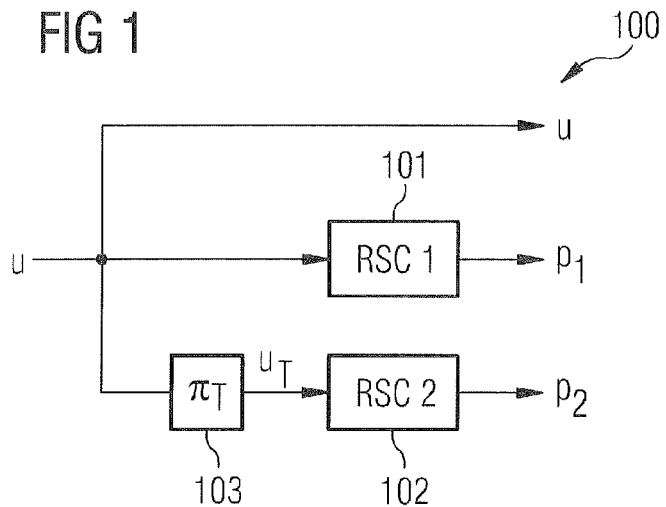
FIG. 1 is a block diagram of an encoder using an interleaving operation according to one embodiment.

In the following detailed description, reference is made to the accompanying drawings, which form a part thereof, and in which is shown by way of illustration specific embodiments in which the invention may be practiced. In the drawings, like reference numerals are generally utilized to refer to like elements throughout the description. In the following description, for purposes of explanation, numerous specific details are set forth in order to provide a thorough understanding of one or more aspects of embodiments of the invention. It may be evident, however, to one skilled in the art that one or more aspects of the embodiments of the invention may be practiced with a lesser degree of these specific details. In other instances, known structures and devices are shown in a simplified representation in order to facilitate describing one or more aspects of the embodiments of the invention. The following description is therefore not to be taken in a limiting sense, and the scope of the invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

The encoders and decoders described herein may be employed in devices of wireless communications systems, in particular in transmitters, receivers and transceivers. They may be employed in base stations as well as in mobile stations.

Encoders and decoders described herein are configured to generate and decode concatenated codes, e.g. parallely concatenated convolutional codes such as e.g. Turbo-codes. These devices may be used in telecommunications systems based on the UMTS (Universal Mobile Telecommunications System) standard, e.g. HSDPA (High Speed Downlink Packet Access).

Encoding data according to a concatenated coding scheme typically involves an interleaver and at least one convolutional encoder. Interleaving and convolutional encoding both provide the signal to be transmitted with a certain amount of robustness. While the convolutional encoder creates and introduces redundancy into the signal to be transmitted, the interleaver reorders the signal to be transmitted in time and thus reduces the effect of symbol group errors during transmission.

By way of example, FIG. 1 illustrates the structure of an encoder 100, such as e.g. a Turbo-encoder. The encoder 100 may comprise a first elementary encoder 101, a second elementary encoder 102 and a code generation interleaver 103. The first and the second elementary encoders may be convolutional encoders such as e.g. recursive systematic convolutional (RSC) encoders.

The encoder 100 receives an information sequence u of length N. N is an integer denoting the number of symbols contained in one data block.

The information sequence u is input to the first elementary encoder 101 which produces a first parity sequence $p_1$. Further, the information sequence u is input to the code generation interleaver 103 which permutes the information sequence u to provide a permuted information sequence $u_T$.

$\pi_T$ denotes the code permutation applied to the information sequence u. The permuted information sequence $u_T$ is fed into the second elementary encoder 102. The second elementary encoder 102 encodes the permuted information sequence $u_T$ and outputs a second parity sequence $p_2$. The output of the encoder 100 is the output sequence (u, $p_1$, $p_2$), i.e. comprises the information sequence u (often referred to as systematic information in the art), the first parity sequence $p_1$ and the second parity sequence $p_2$. It is to be noted that the first and the second parity sequences $p_1$ and $p_2$ may additionally be punctured in order to increase the code rate of encoder 100. Further, the encoder output sequence (u, $p_1$, $p_2$) may be input in a multiplexer (not shown) in order to generate a serial data stream out of the sequences u, $p_1$ and $p_2$, as will be discussed later in conjunction with FIGS. 11 to 13.

It is to be noted that the block length N may be variable and the permutation $\pi_T$ may be a function of the (variable) block length N. By way of example, the UMTS standard specifies $40 \leq N \leq 5114$.

In a receiver, the transmitted code sequence (u, $p_1$, $p_2$) is decoded. c is the code sequence (u, $p_1$, $p_2$) as reconstructed in the receiver. By way of example, sequence c may be produced by a demodulator (not shown) in the receiver. The demodulator may comprise an equalizer such that the sequence c may be an equalized data sequence. Note that the notation c=(u, $p_1$, $p_2$) is somewhat imprecise. As the information sequence u, the first parity sequence $p_1$ and the second parity sequence $p_2$ are typically subjected to noise when transmitted from the encoder 100 via a discrete Gaussian channel to the receiver (in which the decoder 200 is implemented), c should strictly read c=($\bar{u}$, $\bar{p}_1$, $\bar{p}_2$), where the superscript line ("-") distinguishes data reconstructed at the receiver from corresponding data generated in the encoder 100. However, in the following, although keeping that point in mind, the superscript line at the decoder side is suppressed for ease of notation.

Figure 2:
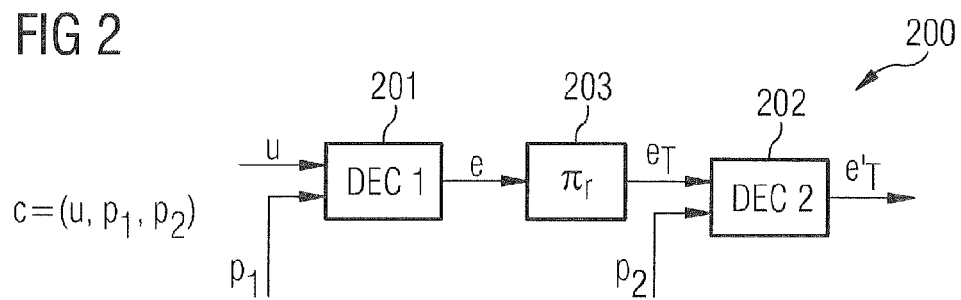
FIG. 2 is block diagram illustrating an embodiment of a decoder for decoding a concatenated code.

FIG. 2 illustrates the principle design of a decoder 200 for decoding a concatenated code. The decoder 200 may comprise a first elementary decoder 201, a second elementary decoder 202 and an interleaver 203 coupled between an output of the first elementary decoder 201 and an input of the second elementary decoder 202. The first elementary decoder 201 and the second elementary decoder 202 may be e.g. designed as symbol-by-symbol a posteriori probability (s/s APP) decoders.

The first elementary decoder 201 decodes the sequence (u, $p_1$). The resulting so-called extrinsic information e is used as a priori information in the second decoding step performed by the second elementary decoder 202. Typically, the extrinsic information e is represented by a sequence of weighted (soft) decisions, e.g. logarithmic reliability data in the form of LLRs (Log-likelihood Ratios). This extrinsic information e may also include the systematic data, i.e. the information sequence u in FIG. 2. Before fed into the second elementary decoder 202, the extrinsic information e is permuted by the interleaver 203 using the code permutation $\pi_T$. The permuted extrinsic information $e_T$ and the (permuted) second parity sequence $p_2$ are fed into the second elementary decoder 202. The second elementary decoder 202 outputs sequence $e'_T$ which is also reliability data representative of estimates (weighted decisions) of the (permuted) information sequence u fed to the encoder 100.

Typically, as will be explained in more detail below, the code sequence (u, $p_1$, $p_2$) is iteratively decoded by the decoder 200. In this case, the sequence $e'_T$ is deinterleaved and then fed back (not shown in FIG. 2) to the first elementary decoder 201, and the sequence (u, $p_1$) is again decoded using the extrinsic information e' obtained from the previous decoding step as a priori information. This iteration is continued until a maximum number of iterations is reached or another stopping criterion is satisfied.

In order to reach a high throughput in the decoder 200, a parallel decoding algorithm may be used. In a parallel decoding algorithm a plurality of processors are simultaneously used to decode the code sequence (u, $p_1$, $p_2$). By way of example, a number of P processors may be used, wherein P is an integer. In this case, in the first decoding step DEC1 illustrated by the first elementary decoder 201, P processors are used to decode the code block (u, $p_1$), and in the second decoding step DEC2 illustrated by elementary decoder 202, e.g. the same P processors may be used to decode the code block ($e_T$, $p_2$). In order to allow for simultaneous operation of P processors on one code block (u, $p_1$) and ($e_T$, $p_2$), respectively, these code blocks are split into several sub-blocks of smaller size $N_{sub} < N$, that are then decoded in parallel. Each sub-block may be stored in a separate buffer, and all buffers may be accessible by all processors. Each buffer can only be accessed by one processor in one clock cycle. Note that $N_{sub}$ should be equal to or greater than P, since otherwise a collision will necessarily be experienced when two processors access the same buffer in one clock cycle.

Parallel decoding works well for the first decoding step DEC1 performed on the sub-blocks of the first code block (u, $p_1$), since the information sequence u is processed in a linear order. By way of example, if two (P=2) processors are used and the code block (u, $p_1$) is divided into two sub-blocks (i.e. $N_{sub}$=2) stored in two separate buffers, one processor may operate on the first buffer storing the first sub-block (i.e. the first half i=1, . . . , N/2 of the first code block (u, $p_1$), where i denotes the discrete time index), and the second processor may operate on the second buffer storing the second sub-block (i.e. the second half i=N/2+1, . . . , N of the first code block (u, $p_1$)). No collision will occur. However, in the second decoding operation DEC2, the interleaved second code block ($e_T$, $p_2$) has to be decoded. Here, when using a parallel decoding algorithm, the following problem may occur in a conventional receiver. In a conventional receiver, the extrinsic information sequence e output by the first elementary decoder 201 is stored in a buffer (not shown in FIG. 2) in the original order before being interleaved in interleaver 203, i.e. in the same order as the received information sequence u. Therefore, the symbols of the permuted extrinsic information $e_T$ are generated on-the-fly, i.e. the corresponding non-permuted symbol is read from the buffer and arranged to the permuted position, when required by the second elementary decoder 202 in the second decoding step DEC2. This may result in a so-called collision, which means that at the same time (i.e. the same clock cycle) two or more symbols (depending on the number of sub-blocks $N_{sub}$) are to be read by two or more processors from the same buffer which is not possible. Only one symbol can be read from one specific buffer at one time (i.e. clock cycle). A collision results in a delay because then, in the first cycle, the first symbol is read from this buffer by a first processor and thereafter, a second cycle is needed in order to read the second symbol from this buffer by the second processor and so forth. Such delay will reduce the overall throughput of the decoder. The number of collisions and hence the reduction in throughput is typically significant so that in conventional decoders, the throughput requirements for a given clock frequency of the hardware can not be met in some cases.

Figure 3:
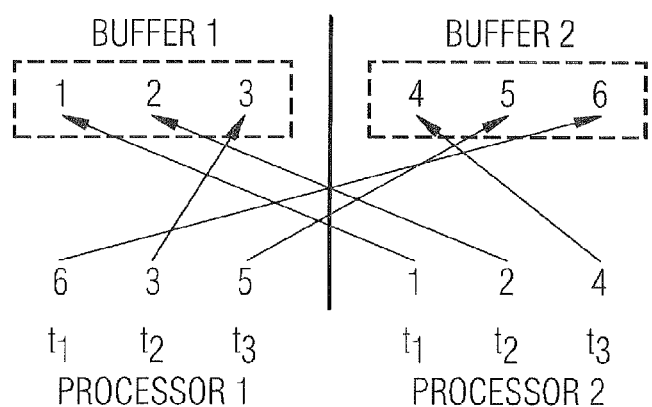
FIG. 3 is a diagram illustrating an example of a permutation resulting in buffer access collisions.

FIG. 3 illustrates a simplified example of a permutation resulting in collisions when using a parallel decoding algorithm. The non-permuted sequence 1, 2, 3, 4, 5, 6 is shown in the upper row and the permuted sequence 6, 3, 5, 1, 2, 4 is shown the lower row. The block has a length of N=6 and is split in two sub-blocks $N_{sub}=3$, with the symbols 1, 2, 3 forming part of the first sub-block and the symbols 4, 5, 6 forming part of the second sub-block. The symbols 1, 2, 3 of the first sub-block are stored in buffer 1 and the symbols 4, 5, 6 of the second sub-block are stored in buffer 2. Two processors (P=2), namely processor 1 and processor 2 are used to decode the code block (1, 2, 3, 4, 5, 6). At time $t_1$, processor 1 operates on the first symbol of the first sub-block of the permutated data (i.e. symbol 6) and the second processor operates on the first symbol of the second sub-block of the permutated data (i.e. symbol 1). No collision occurs since these two symbols come from different buffers (buffer 2 and buffer 1, respectively). However, at time $t_2$, processor 1 has to operate on symbol 3 and processor 2 has to operate on symbol 2, wherein both symbols stem from the same buffer (buffer 1). Thus, at time $t_2$ a collision occurs. Likewise, at time $t_3$, another collision occurs since both processors have to operate on symbols (symbols 5, 4) stored in the same buffer (buffer 2).

Figure 4:
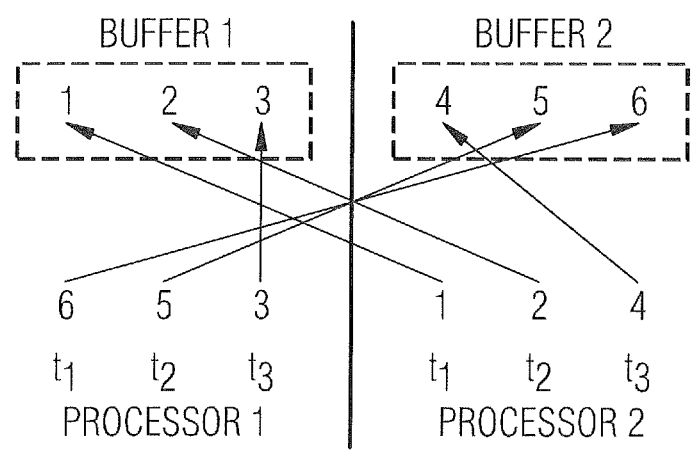
FIG. 4 is a diagram illustrating an example of a permutation impeding buffer access collisions.

FIG. 4 shows a diagram similar to the diagram of FIG. 3, however applying another permutation. In this permutation, the data sequence (1, 2, 3, 4, 5, 6) is permuted into the (permuted) sequence (6, 5, 3, 1, 2, 4). As can easily be seen from FIG. 4, this permutation is suited better for parallel decoding since it does not cause any collisions when the block is divided into two sub-blocks and processed by two processors as explained in conjunction with FIG. 3. At any times $t_1$, $t_2$, $t_3$, the processors 1, 2 access different buffers 1, 3. In other words, the permutation depicted in FIG. 4 is contention-free, whereas the permutation depicted in FIG. 3 causes memory contention.

According to the examples shown in FIGS. 3 and 4, the number of collisions in parallel decoding depends on the permutation which has to be applied on reading data from shared buffers during parallel decoding using a plurality of processors. According to one embodiment, an interleaver is used for re-arranging the extrinsic information sequence e before writing it to the buffers. In other words, a permuted information sequence is stored in the buffers, where this permutation does not necessarily equal the permutation $\pi_T$ of the concatenated coding scheme. As a consequence, a different permutation is used in the decoding procedure with respect to the second decoding step DEC2. On the other hand, since the order of the information sequence u is changed, a permutation is also involved in the first decoding step DEC1 accomplished by the first elementary decoder 201.

Figure 5A:
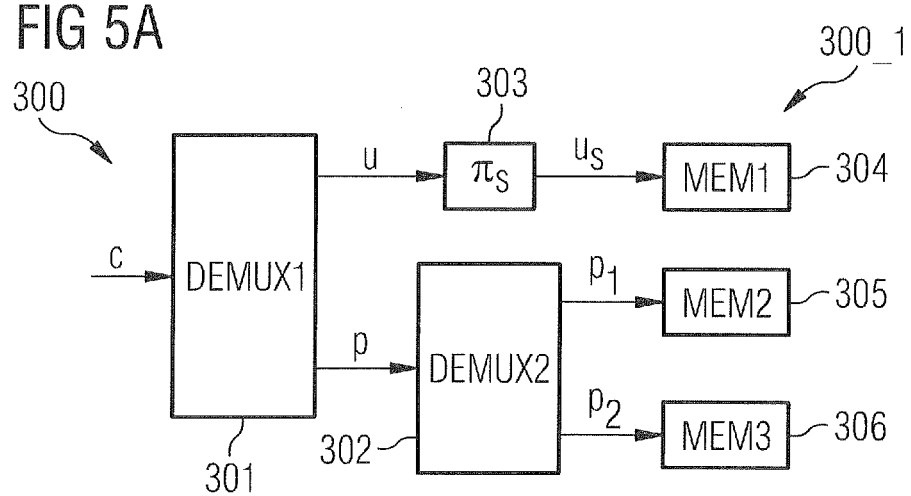
FIGS. 5A to 5C are block diagrams illustrating a decoder according to one embodiment.
Figure 5B:
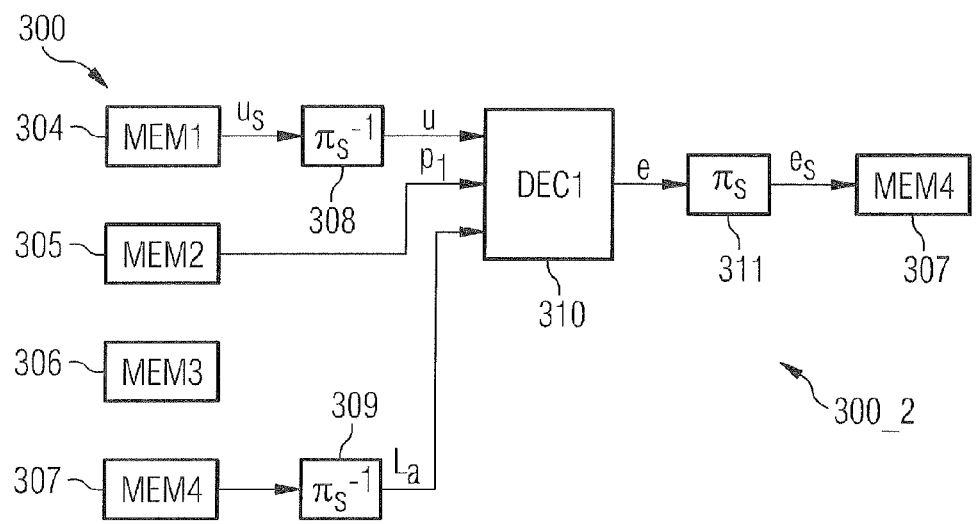
Figure 5C:
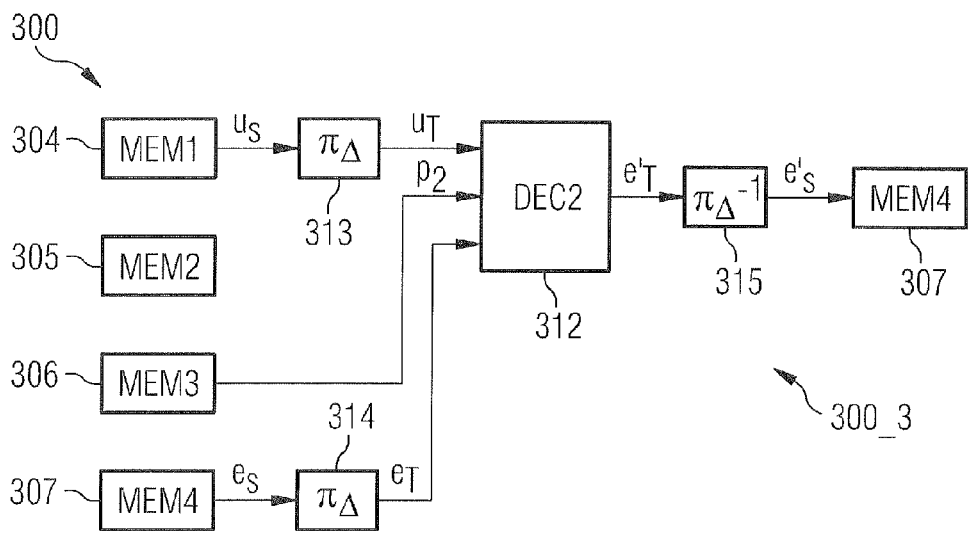

FIGS. 5A to 5C illustrate a block diagram of a decoder 300 according to one embodiment. The decoder 300 basically has the same structure as the decoder 200 shown in FIG. 2, however, decoder 300 is illustrated in greater detail.

FIG. 5A illustrates a block diagram of a first section 300_1 of the decoder 300. The first section 300_1 may comprise a first demultiplexer 301, a second demultiplexer 302, a storage interleaver 303 and three memories 304, 305 and 306.

The first demultiplexer 301 splits the equalized sequence c into the information sequence u and a parity sequence p=($p_1$, $p_2$). The parity sequence p is split by the second multiplexer 302 into the first parity sequence $p_1$ and the second parity sequence $p_2$. Note again that u, $p_1$ and $p_2$ are reconstructed versions of the data sequences u, $p_1$ and $p_2$ generated in the encoder 100, respectively. Further, note that $p_2$ involves code-interleaved data, i.e. data interleaved by the permutation $\pi_T$.

The first parity sequence $p_1$ is stored in the second memory 305 and the second parity sequence $p_2$ is stored in the third memory 306. According to one embodiment, the information sequence u is fed into the storage interleaver 303 and permuted according to the storage permutation $\pi_S$. Then the permuted (i.e. storage-interleaved) information sequence $u_S$ is stored in the first memory 304. Thus, note that the information data is not stored in its temporal order but is re-ordered in time by the application of the storage permutation $\pi_S$.

FIG. 5B illustrates a second section 300_2 of a block diagram of the decoder 300. The second section 300_2 refers to the first decoding step referred to as DEC1 in FIG. 5B.

The second section 300_2 of decoder 300 comprises the first, second and third memories 304, 305 and 306, a fourth memory 307, a first storage deinterleaver 308, a second storage deinterleaver 309, a first elementary decoder 310 and a storage interleaver 311. The first elementary decoder 310 may be identical to the first elementary decoder 201 of FIG. 2. The storage interleaver 311 may use the same storage permutation $\pi_S$ as the storage interleaver 303. Further, the first and second storage deinterleavers 308, 309 may use the inverse permutation $\pi_S^{-1}$.

As already explained in conjunction with FIG. 2, the first elementary decoder 310 operates on the (reconstructed) information sequence u and on the (reconstructed) first parity sequence $p_1$. To this end, the first elementary decoder 310 accesses the first memory 304 via storage deinterleaver 308 and the second memory 305. Typically, the first elementary decoder 310 computes a sequence e of reliability data, which may be output in the form of LLRs (Log-Likelihood Ratios). This sequence e of reliability data is interleaved by storage interleaver 311 using the storage permutation $\pi_S$. The sequence $e_S$ of storage-permuted reliability data is stored in the fourth memory 307.

Section 300_3 of decoder 300 illustrates the concatenated second decoding step carried out by second elementary decoder 312 and referred to as DEC2. As mentioned in conjunction with FIG. 2, the second decoding step DEC2 may operate on code-interleaved data, e.g. on the code-permuted information sequence $u_T$, the (code-permuted) second parity sequence $p_2$ and the code-permuted extrinsic data sequence $e_T$. To this end, in order to receive code-interleaved data, the first memory 304 is read out via a first read-out interleaver 313, the fourth memory 307 is read out via a second read-out interleaver 314 and the third memory 306 storing the (reconstructed code-permuted) second parity sequence $p_2$ is directly read out by the second elementary decoder 312. As already mentioned in conjunction with FIG. 2, the second elementary decoder 312 computes a code-interleaved sequence $e'_T$ of reliability data associated with the information sequence u. This code-interleaved sequence $e'_T$ is deinterleaved in a deinterleaver 315 and then stored in the fourth memory 307.

The first and second read-out interleavers 313 and 314 apply a so-called differential permutation $\pi_\Delta$ to the incoming data sequence. The differential permutation $\pi_\Delta$ is the concatenation of the code generation permutation $\pi_T$ and the inverse of the storage permutation $\pi_S^{-1}$, i.e. may be written as $$\pi_\Delta = \pi_T(\pi_S^{-1}). \tag{1}$$

The deinterleaver 315 applies the inverse differential permutation $\pi_\Delta^{-1}$ generating a sequence $e'_S$ of reliability data arranged in an order given by the storage permutation $\pi_S$. This sequence $e'_S$ is e.g. stored in the fourth memory 307 by overwriting the sequence $e_S$ of storage-permuted reliability data.

The first and second decoding steps DEC1 and DEC2 explained above are part of the first decoding iteration. In the second decoding iteration, the process described in conjunction with FIGS. 5A, 5B and 5C is repeated. Now, the fourth memory 307 contains the storage-interleaved sequence $e'_S$ of reliability data. In the first decoding step of the second iteration, the sequence $e'_S$ is read by the first elementary decoder 310 via storage deinterleaver 309 and is the extrinsic information of the previous decoding step that is used as a priori information in the current decoding step. The sequence e of updated reliability data computed by the first elementary decoder 310 is then storage-permuted by storage interleaver 311, stored in the fourth memory 307 and used as updated extrinsic information in the second decoding step (DEC2) of the second iteration (note that the index indicating the decoding iteration is suppressed). This process is continued until a given number of iterations is reached or another stopping criterion is satisfied.

From the foregoing description it is evident that the first and second parity data $p_1$ and $p_2$ are read out from second and third memories 305, 306, respectively, in their original order, whereas the information sequence u and the extrinsic information sequence e are stored in the first and fourth memories 304 and 307, respectively, in an order determined by the storage permutation $\pi_S$ and read out in an order which compensates for the storage permutation, namely in the order given by the inverse storage permutation $\pi_S^{-1}$ for the first decoding step DEC1 or given by the order of the differential permutation $\pi_\Delta$ for the second decoding step DEC2.

FIG. 7 illustrates the new storage order. The first memory 304 is shown to be a buffer of length N, i.e. having N storage cells. The information sequence u is stored in the first memory 304 not in its natural order but in a different order, i.e. before writing data to the memory 304, the information sequence u is permuted using the storage permutation $\pi_S$. Therefore, the stored information sequence is given by $$\tilde{u} = \pi_S(u), \quad (2)$$

where $\pi_S(\bullet)$ denotes the storage permutation operation. As a result of this re-ordering, a permutation is necessary in the first decoding step carried out by the first elementary decoder 310 and referred to as MAP 1 in FIG. 7. This permutation is given by the inverse storage permutation $\pi_S^{-1}$ and is carried out by the first storage deinterleaver 308. In addition, the permutation used in the second decoding step DEC2, which is carried out by the second elementary decoder 312 and referred to as MAP 2 in FIG. 7, is given by the differential permutation, i.e. $\pi_\Delta$, and is carried out by the first read-out interleaver 313.

The new storage order explained above in conjunction with FIG. 7 is different to the conventional storage order of the information sequence u which is shown in FIG. 6. Conventionally, the information sequence u is stored in a linear order in the first memory 304 and is linearly read from the first memory 304 in the first decoding step DEC1 denoted as MAP 1 in FIG. 6. Conventionally, in the second decoding step DEC2 denoted as MAP 2, the information sequence u is read out using the code generation permutation $\pi_T$ of the concatenated convolutional code. No storage permutation $\pi_S$ is used to load the first memory 304 and no inverse storage permutation $\pi_S^{-1}$ is used to read data out of the first memory 304.

It is to be noted that FIG. 7 also applies to the write and read operations used with the fourth memory 307 during the first and second decoding steps DEC1, DEC2.

The use of the storage permutation $\pi_S$ on writing data to the first and second memories 304, 307 gives an additional degree of freedom. Since the structural properties of the concatenated convolutional code are fixedly given by the code generation permutation $\pi_T$, the storage permutation $\pi_S$ can be designed in such a way that the number of collisions caused by $\pi_S^{-1}$ (MAP 1) and $\pi_\Delta$ (MAP 2) is significantly reduced compared to the original permutation $\pi_T$ (MAP 2). This is possible since the problem of collisions is not symmetric with respect to a permutation and its inverse permutation, i.e. if a permutation causes many collisions, its inverse permutation does not necessarily cause the same number of collisions. In contrast, it may cause significantly less (or even more) collisions. This allows to shift the collisions to the storage permutation $\pi_S$ (these collisions have no negative effect on the performance of the decoder) and to reduce the number of collisions caused by $\pi_S^{-1}$ and $\pi_\Delta$ at the same time. If the sum of the number of collisions caused by $\pi_S^{-1}$ and $\pi_\Delta$ is smaller than the number of collisions caused by the code generation permutation $\pi_T$, the number of collisions during decoding is lowered and, as a result, the throughput of the decoder 200, 300 is enhanced.

FIG. 8 is a block diagram illustrating a part of a decoder circuitry according to one embodiment. Here, by way of example, the first elementary decoder 310 is implemented by two processors 310_1 and 310_2. The storage deinterleaver 308 is configured for parallel processing and may e.g. comprise a first storage deinterleaver 308_1 and a second storage deinterleaver 308_2 arranged in parallel and applying both the inverse storage permutation $\pi_S^{-1}$. The first memory 304 may be divided into e.g. four buffers 304_1, 304_2, 304_3, 304_4. Each buffer stores a number of $N_{sub}$ symbols. Thus, the first buffer 304_1 stores the symbols of the first sub-block $(\tilde{u}_1, \ldots, \tilde{u}_{N_{sub}})$, the second buffer 304_2 stores the symbols of the second sub-block $(\tilde{u}_{N_{sub}+1}, \ldots, \tilde{u}_{2N_{sub}})$, the third buffer 304_3 stores the symbols of the third sub-block $(\tilde{u}_{2N_{sub}+1}, \ldots, \tilde{u}_{3N_{sub}})$ and the fourth buffer 304_4 stores the symbols of the fourth sub-block $(\tilde{u}_{3N_{sub}+1}, \ldots, \tilde{u}_N)$. It is to be noted that for the sake of simplicity, it is assumed that the ratio $N/N_{sub}$ is an integer, e.g. 4. The number of sub-blocks may be equal or larger than the number P of processors in order to allow for a contention-free parallel reading operation of processors 310_1 and 310_2 from memory 304.

As has been illustrated in FIGS. 3 and 4, the storage permutation $\pi_S$ can be devised such that on using the inverse storage permutation $\pi_S^{-1}$, the processors 310_1 and 310_2 may access the memory 304 without collisions. This means that the processors 310_1 and 310_2 access in each cycle different sub-buffers 304_1, 304_2, 304_3, 304_4. If the storage permutation $\pi_S$ can not strictly guarantee a contention-free operation, the number of collisions may at least be kept very low.

The structure shown in FIG. 8 analogously applies for the implementation of the fourth memory 307 and the second storage deinterleaver 309 as coupled to the first elementary decoder 310. Here, the fourth memory 307 is likewise divided into a number of e.g. four buffers and the second storage deinterleaver 309 is configured in a similar manner for parallel processing.

Further, the implementation shown in FIG. 8 similarly applies to the second decoding step DEC2. The elementary decoder 312 used in the second decoding step DEC2 may be implemented by the same parallel processors 310_1, 310_2 as used in the first decoding step DEC1. The first differential read-out interleaver 313 may be implemented by a number of P parallel interleavers as illustrated in FIG. 8 for the storage interleaver 308, however each of these parallel read out-interleavers are configured to use the differential permutation operation $\pi_\Delta$. Likewise, the structure shown in FIG. 8 analogously applies to the implementation of the fourth memory 307 and the second differential read-out interleaver 314 connected to the second elementary decoder 312. Again, in this case the fourth memory 307 is designed in accordance with the first memory 304 shown in FIG. 8 and the second differential read-out interleaver 314 is designed in a parallel arrangement similar to the first differential read-out interleaver 313 as explained above.

FIG. 9 depicts an example of the scheduling of a parallel decoder with two processors P1 and P2 according to one embodiment. The parallel decoder may be designed according to the embodiments shown in FIGS. 5A-C and 8. Here, it is assumed that two processors are used and that the code block is split into two sub-blocks of half the size of the block code, i.e. $2*N_{sub}=N$. By way of example, the embodiment of FIG. 8 applies if the first and second buffer 304_1 and 304_2 are composed to form a first buffer to store the first half of the block code and the third and the fourth buffers 304_3 and 304_4 are composed to form a second buffer to store the second half of the block code.

In the embodiment shown in FIG. 9, the decoding algorithm uses the sliding window technique. The sliding window technique is based on two fundamental operations, namely the forward recursion frec and the backward recursion brec. During the symbol estimation process both recursions must be carried out in order to calculate the reliability information sequence e in the first decoding step DEC1 and the reliability information sequence e' in the second decoding step DEC2. The sliding window technique comprises the recursion runs being carried out window-by-window. The position of the window is then shifted in steps over the entire block length.

More specifically, the first processor P1 (lower part of FIG. 9) operates on the first half of the code block and the second processor P2 (upper part of FIG. 9) concurrently operates on the second half of the code block. The first half of the code block is divided into windows W1, W2, . . . , whereas the second half of the code block is divided into windows $W_m$, $W_{m+1}$, . . . . Each window may have the same size $N_W$, and typically, the window size $N_W$ is smaller than the sub-block size, i.e. $N_W < N_{sub}$.

In the first processor P1 (lower part of FIG. 9), the forward recursion frec starts at time $t_0$ at the beginning of the initial window W1. At the same time $t_0$, the initial backward recursion brec0 starts at the end of the next window W2. This scheduling is associated with an initial delay. When the forward recursion frec reaches the end of the initial window W1 at time $t_1$, a second backward recursion brec1 is started at the end of the third window W3. The forward recursion frec is continued between time $t_1$ and time $t_2$ in the second window W2, while the first backward recursion brec0 operates on the first window W1. During the time interval $t_1$ to $t_2$, decoding results res0 for the first window W1 are output. During time interval $t_2$ to $t_3$, the backward recursion brec1 processes the second W2 and concurrently, decoding results res1 for the second window W2 are output. This process is continued until the last window of the first half of the code block is reached and decoded.

At the same time, the same process is performed on the second half of the code block, i.e. on windows $W_m$, $W_{m+1}$, . . . . Here, the second processor P2 starts the forward recursion frec at the beginning of the initial window $W_m$ at time $t_0$ and starts the first backward recursion brec0 at the same time at the end of window $W_{m+1}$, and so forth. For that reason, both processors P1, P2 may try to access symbols from the same buffer at the same time. In conventional decoding, as explained above, collisions may occur in the second decoding step DEC2 when both processors P1, P2 are decoding the code-permuted information sequence $u_T$ together with the (code-permuted) second parity sequence $p_2$. When using the storage permutation $\pi_S$ for storing data in the first and fourth memories 304, 307, collisions may occur depending on the storage permutation $\pi_S$ both in the first and the second decoding steps DEC1, DEC2 on reading data out of the memories 304, 307, however, the total number thereof may be reduced.

Many variants of the sliding window scheduling algorithm are possible which depart from the particular example given above. By way of example, the forward and backward window sizes need not to be of equal length and/or multiple forward and/or backward recursions can be used within one processor to further reduce the state metric requirement over the window for which the reliability data (LLRs) are generated.

In one embodiment, the storage permutation $\pi_S$ is chosen such that either in the first decoding step DEC1 or in the second decoding step DEC2 or in the first and second steps DEC1, DEC2 no collisions occur.

Figure 10:
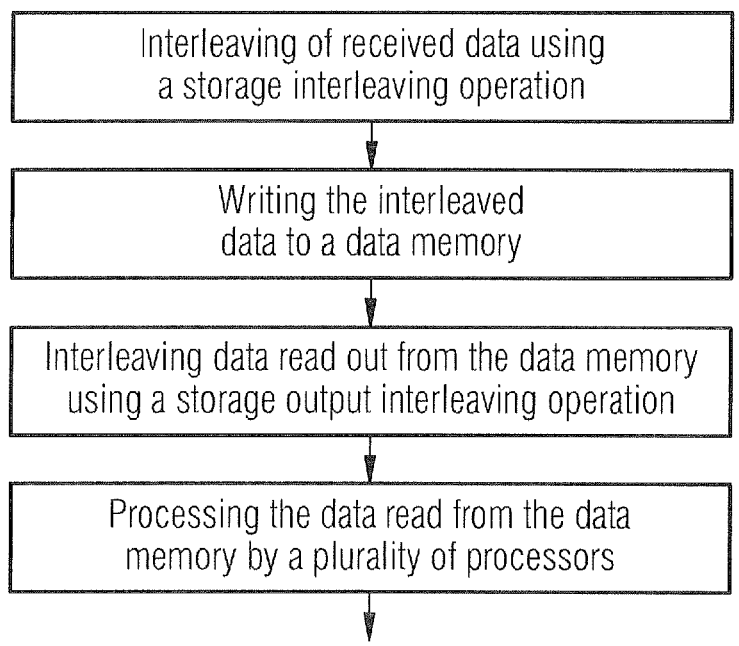
FIG. 10 is a flowchart of a method of decoding a concatenated code according to one embodiment.

FIG. 10 is a flowchart of a method of decoding a concatenated code according to one embodiment. As already described, received data is storage-interleaved using a storage interleaving operation $\pi_S$. The storage-interleaved data is then written to a data memory, which e.g. may be composed of a number of buffers. A storage output interleaving operation such as e.g. $\pi_S^{-1}$ or $\pi_A$ is used to read out data from the data memory. The data read out from the memory is then processed by a plurality of processors P1, P2.

In one embodiment, the storage permutation $\pi_S$ may be applied already in the transmitter. In this case, the information sequence u is rearranged or re-ordered before transmission using the storage permutation $\pi_S$ such that the (reconstructed) information sequence u can be directly stored in the receiver upon reception. In this case, the storage interleaver 303 shown in FIG. 5A can be omitted and thus, the complexity of the decoder 300 in the receiver can be further reduced.

Figure 11:
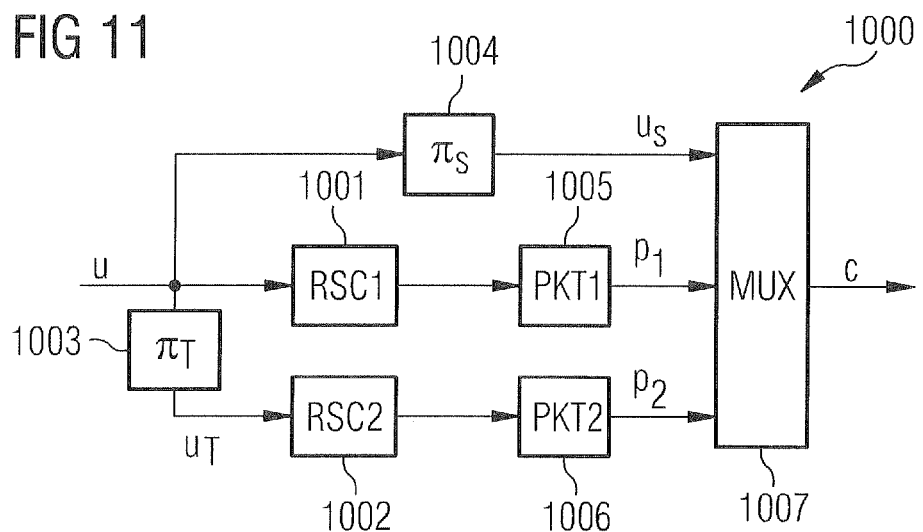
FIG. 11 is a block diagram illustrating an encoder according to one embodiment.

FIG. 11 illustrates a block diagram of an encoder 1000 according to one embodiment. The encoder 1000 may comprise a first elementary encoder 1001, a second elementary encoder 1002, a code interleaver 1003 using the code generation permutation $\pi_T$ and a storage interleaver 1004 using the storage permutation $\pi_S$. Further, the encoder 1000 may comprise a first puncturing device 1005, a second puncturing device 1006 and a multiplexer 1007.

Similar to the encoder 100 of FIG. 1, the code interleaver 1003 permutes the information sequence u and the second elementary encoder 1002, which may be a recursive systematic convolutional (RSC) encoder, encodes the permuted information sequence $u_T$ using, for instance, a convolutional code. The first elementary encoder 1001, which may also be a recursive systematic convolutional (RSC) encoder, encodes the non-permuted information sequence u. Further, the non-permuted information sequence u is interleaved by the storage interleaver 1004 to obtain a storage-interleaved information sequence $u_S$. An input to the first optional puncturing device 1005 is coupled to an output of the first elementary encoder 1001 and provides the first parity sequence $p_1$, and an input to the second optional puncturing device 1006 is coupled to an output of the second elementary encoder 1002 to provide the second parity sequence $p_2$. The optional multiplexer 1007 may be used to serialize the encoder output sequence $c=(u_S, p_1, p_2)$. Note that in encoder 1000 only the information sequence u is storage-permuted, whereas the first and second parity sequences $p_1$, $p_2$ are not storage-permuted.

Figure 12:
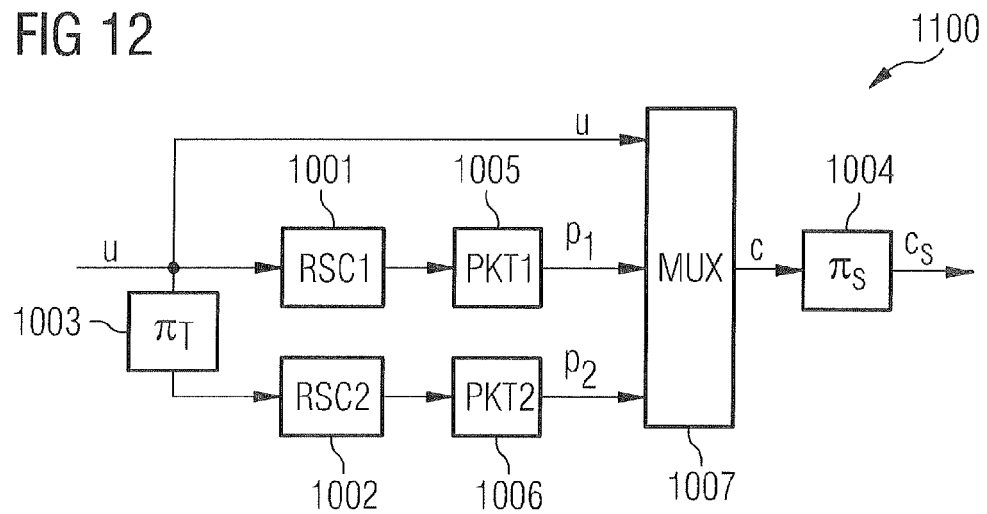
FIG. 12 is a block diagram illustrating an encoder according to one embodiment.

FIG. 12 illustrates a block diagram of an encoder 1100 according to one embodiment. Components similar to components shown in FIG. 11 are referred to by the same reference signs. In encoder 1100 the multiplexer output sequence $c=(u, p_1, p_2)$ is subjected to a storage permutation $\pi_S$ by storage interleaver 1004 coupled to an output of the multiplexer 1007. Thus, the output sequence of encoder 1100 is $c_S=(u_S, p_{1S}, p_{2S})$. Again, the puncturing devices 1005 and 1006 are optional.

Figure 13:
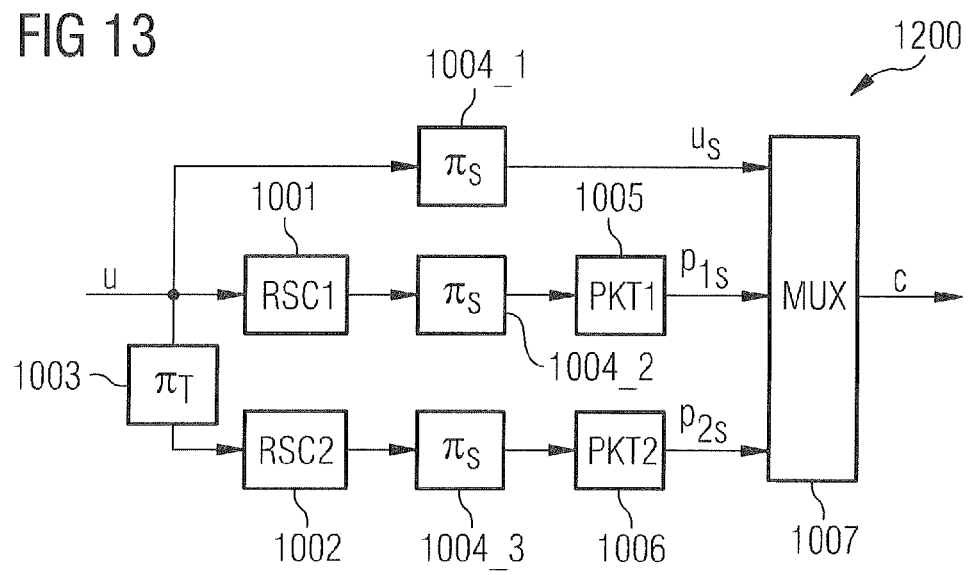
FIG. 13 is a block diagram illustrating an encoder according to one embodiment.

Another implementation of an encoder 1200 according to one embodiment is shown in FIG. 13. Again, similar components are referred to by the same reference signs. Here, similar to encoder 1100 of FIG. 12, the information sequence u, the first parity sequence and the second parity sequence are subjected to a storage permutation in storage interleavers 1004_1, 1004_2 and 1004_3. However, in contrast to the encoder 1100 of FIG. 12, the storage interleaver 1004_2 is coupled between the first elementary encoder 1001 and the first puncturing device 1005, and the storage interleaver 1004_3 is coupled between the second elementary encoder 1002 and the second puncturing device 1006. That way, the puncturing operations performed on the first and second parity data are applied to the storage-permuted parity data rather than to the non-permuted parity data.

FIG. 14 is a flowchart of a method of generating a concatenated code sequence from a data input sequence according to one embodiment. The input data sequence is interleaved by applying a code generation interleaving operation $\pi_T$. The interleaved data sequence is encoded using a convolutional encoder (such as convolutional encoder 1002) to generate an interleaved encoded data sequence. On the other hand, the input data sequence is storage-interleaved by applying a storage interleaving operation $\pi_S$.

In some cases, the throughput of a receiver can be increased when the storage permutation is chosen to be the code generation permutation, i.e. $\pi_S=\pi_T$. In this specific case, the differential permutation $\pi_\Delta$ reduces to the identical permutation, i.e. no permutation in fact. By way of example, for HSDPA, using two sub-blocks (i.e. two buffers), two processors and this specific storage permutation $\pi_S=\pi_T$, the throughput can be increased from e.g. 18.24633 Mbit/s (when no storage permutation is used) to e.g. 20.79122 Mbit/s at a clock frequency of 250 MHz, i.e. a gain of almost 14% is possible with this simple step (the required throughput is e.g. 20.736 Mbit/s). With a more sophisticated storage permutation, the throughput was further increased to 21.556887 Mbit/s, and even larger gains are to be expected.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. This application is intended to cover any adaptations or variations of the specific embodiments discussed herein, and the invention is intended to be limited only by the claims and the equivalence thereof.

What is claimed is:

1. A decoder for decoding received data encoded with a concatenated code, the code being generated by using a code generation interleaving operation, comprising:
    a storage input interleaver for storage-interleaving of the received data using a storage interleaving operation, wherein the received data comprises a serial data stream and the storage interleaving operation comprises reordering data elements of the serial data stream to form storage-interleaved data;
    a data memory coupled to an output of the storage input interleaver for temporary storage of the storage-interleaved data;
    a first storage output interleaver coupled to an output of the data memory for interleaving of the storage-interleaved data read from the data memory, wherein interleaving comprises reordering of the storage-interleaved data by applying a permutation to reconstruct the received data;
    one or more processors coupled to an output of the first storage output interleaver to access the data memory via the first storage output interleaver, wherein the one or more processors receive and operate on the reconstructed received data to form a sequence of reliability data, wherein the sequence of reliability data and the received data are different; and
    a second storage output interleaver coupled to an output of the data memory for interleaving of the storage-interleaved data read from the data memory;
    wherein the interleaving operation of the second storage output interleaver is a concatenation of the code generation interleaving operation and the inverse of the storage interleaving operation.

2. The decoder of claim 1, wherein the data memory comprises a plurality of buffers.

3. The decoder of claim 2, wherein each buffer is configured to be accessed by one processor on a given clock cycle.

4. The decoder of claim 1, wherein the storage interleaving operation is identical to the code generation interleaving operation.

5. The decoder of claim 1, wherein the storage interleaving operation is different than the code generation interleaving operation.

6. The decoder of claim 1, wherein the interleaving operation of the first storage output interleaver is the inverse of the storage interleaving operation of the storage input interleaver.

7. The decoder of claim 1, wherein the storage interleaving operation is configured such that a number of collisions when reading the storage-interleaved data from the data memory via the first storage output interleaver plus the number of collisions when reading the storage-interleaved data from the data memory via the second storage output interleaver is less than the number of collisions when reading data, which have been written to the data memory without using a storage interleaving operation, from the data memory via a storage output interleaver using the code generation interleaving operation.

8. A method of decoding received data encoded with a concatenated code, the code being generated by using a code generation interleaving operation, comprising:
    storage-interleaving the received data using a storage interleaving operation, wherein the received data comprises a serial data stream and the storage-interleaving operation comprises reordering data elements of the serial data stream to form storage-interleaved data;
    writing the storage-interleaved data to a data memory;
    interleaving the storage-interleaved data read from the data memory using a first storage output interleaving operation which comprises applying a permutation to reconstruct the received data;
    processing the reconstructed received data by one or more processors to form a sequence of reliability data, wherein the sequence of reliability data and the received data are different; and
    interleaving the storage-interleaved data read from the data memory using a second storage output interleaving operation to form re-ordered data, wherein the second interleaving operation is a concatenation of the code generation interleaving operation and the inverse of the storage interleaving operation.

9. The method of claim 8, wherein the data memory comprises a plurality of buffers, the method further comprising:
    accessing each buffer by one processor at most on a given clock cycle for processing the re-ordered data.

10. The method of claim 8, wherein the storage interleaving operation is identical to the code generation interleaving operation.

11. The method of claim 8, wherein the first storage output interleaving operation is the inverse of the storage interleaving operation.

12. The method of claim 8, wherein the storage interleaving operation is configured such that a number of collisions when reading the storage-interleaved data from the data memory using the first storage output interleaving operation plus the number of collisions when reading the storage-interleaved data from the data memory using the second storage output interleaving operation is less than the number of collisions when reading data, which have been written to the data memory without using a storage interleaving operation, from the data memory using the code generation interleaving operation.

13. The decoder of claim 1, wherein the data elements of the serial data stream are reordered in time.

14. The decoder of claim 1, wherein the data elements of the serial data stream are reordered with respect to each other.

\* \* \* \* \*